United States Patent [19]

Boudreau et al.

[11] Patent Number: 4,778,401
[45] Date of Patent: Oct. 18, 1988

[54] EXTRACTION-INSERTION CARD GUIDE MECHANISM

[75] Inventors: Ronald B. Boudreau, Acton, Mass.; Charles Termini, Kirkland, Wash.

[73] Assignee: Digital Equipment Corporation, Maynard, Mass.

[21] Appl. No.: 55,197

[22] Filed: May 28, 1987

[51] Int. Cl.[4] .............................................. H01R 13/62
[52] U.S. Cl. .................................. 439/153; 439/157; 361/415
[58] Field of Search .............. 439/152, 153, 155, 157, 439/159, 160, 59, 60, 61, 62, 180, 325, 327, 328, 329; 361/412, 413, 414, 415

[56] References Cited

U.S. PATENT DOCUMENTS

| | | | |
|---|---|---|---|
| 3,130,351 | 4/1964 | Giel | 439/329 |
| 3,261,634 | 7/1966 | Hewson | 439/152 |
| 3,853,379 | 12/1974 | Goodman et al. | 439/261 |
| 4,047,782 | 9/1977 | Yeager | 439/64 |
| 4,155,109 | 5/1979 | Finch et al. | 361/415 |
| 4,550,836 | 11/1985 | Ellis | 439/325 |

Primary Examiner—Gil Weidenfeld
Assistant Examiner—David Pirlot
Attorney, Agent, or Firm—Cesari & McKenna

[57] ABSTRACT

A card cage includes upper and lower support members which define a slot for receiving a printed circuit board. An engagement mechanism includes one or more handles pivotally mounted on the front of the card cage. Each handle, in turn, is pivotally attached to a rod which extends to the rear of the card cage and terminates in an extraction member which receives the rear corner of a cirucit board. When the circuit board is mounted in the card cage, the handle is pivoted to contact the forward edge of the board and urge it into position in the cage, thereby urging contacts along the rear edge of the board into engagement with a connector at the rear of the card cage. When the board is to be removed from the card cage, the handle is pivoted in the opposite direction, enabling the extraction member at the rear to pull the board forwardly out of engagement with the connector and permitting the board to then be removed from the card cage.

15 Claims, 2 Drawing Sheets

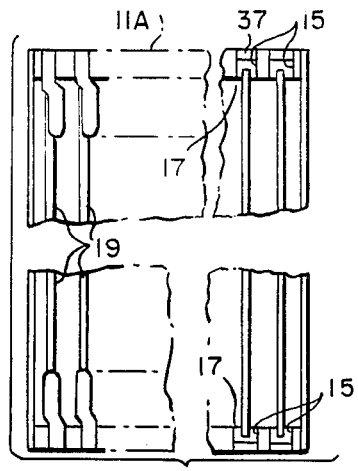
FIG. 1
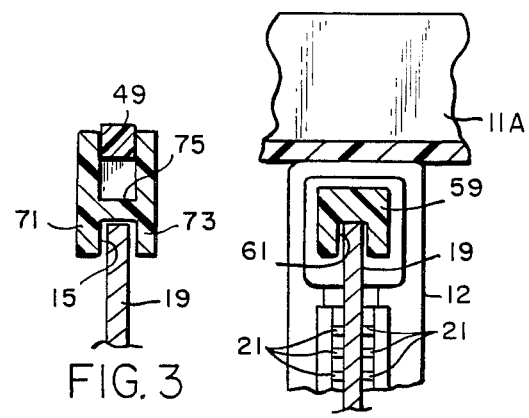
FIG. 3
FIG. 4
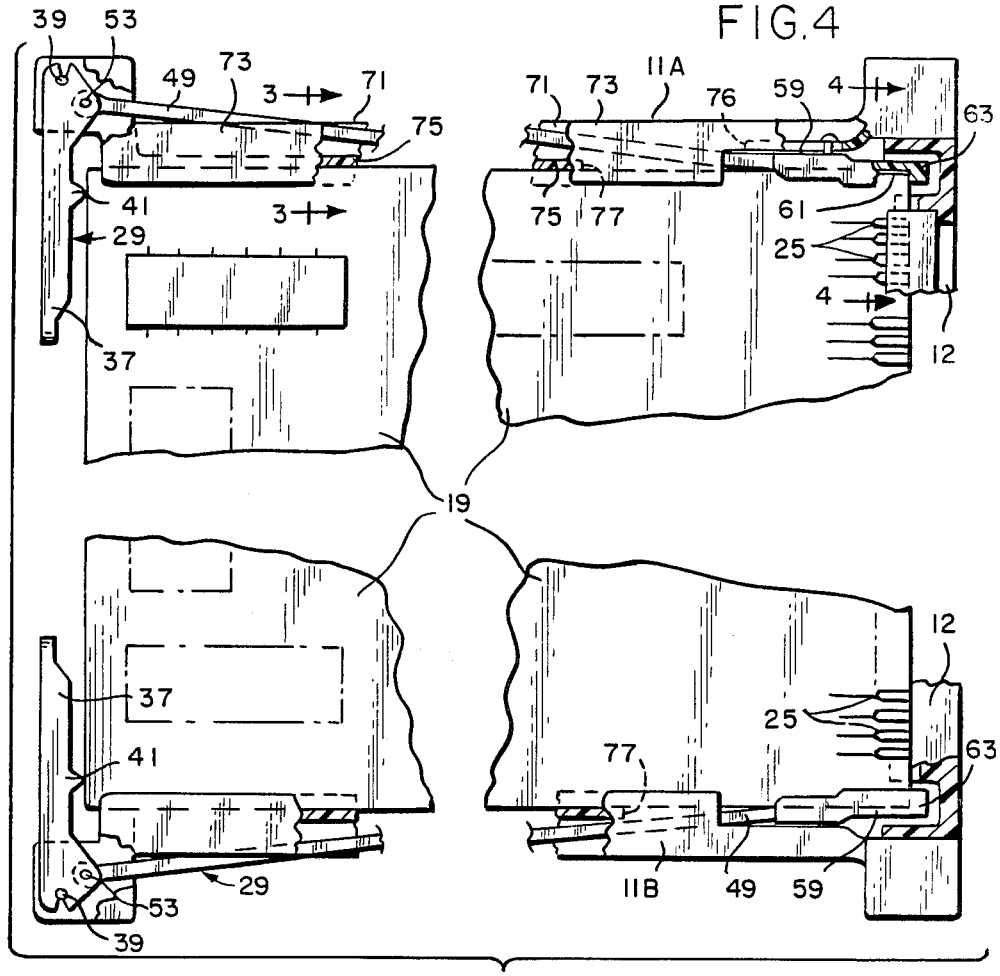
FIG. 2

EXTRACTION-INSERTION CARD GUIDE MECHANISM

BACKGROUND OF THE INVENTION

This invention relates generally to the field of housings for electrical and electronic devices, and more specifically to an improved apparatus for inserting circuit boards into and extracting them from, a card cage which is typically used to hold and interconnect a plurality of circuit boards.

DESCRIPTION OF PRIOR ART

Circuit boards are widely used to reliably support and interconnect a large number of electrical components. A number of circuit boards and other elements are typically interconnected to form a system, such as a digital data processing system. Typically, the circuit boards are mounted in card cages which removably support several circuit boards in parallel slots. To the rear of a card cage is a backplane comprising connectors and wiring which serve to interconnect the boards. A circuit board includes electrical contacts along one edge which mate with a connector in the backplane. Inserting the boards into the card cage so as to engage the connectors in the backplane effects the required interconnection. Connectors in the backplane also affect connections to other devices, such as printers, video display terminals and the like.

Advances in circuit board technology permit ever-increasing numbers of circuit components to be mounted on a single circuit board. As more of this occurs, more contacts generally must be provided along the edge of the board. The increased number of components and contacts on the boards have increased the likelihood of damage to the board during insertion of the board into, and extraction of the board from, the card cage. Furthermore, while the desire to mount more and more electrical components on the board tends to reduce the amount of space required for a system, it also increase the difficulty of providing space on the board to provide mechanisms for inserting circuit boards into, and removing them from their engage positions.

Several types of edge connectors are used in card cage backplanes. One type, which is generally known as Zero-Insertion-Force (ZIF) connectors, employ a plurality of conductive tabs which are retracted while the board is being inserted into and removed from the card cage. After the board is inserted, an actuator enables the tabs to advance to and phsically, and thereby electrically, contact the contacts on the circuit board. Thus no force is required on the board to insert the board into the connector. The actuator retracts the connector's contacts while the board is being removed from the card cage, and so no force is required on the circuit board to disengage the board from the connector.

ZIF connectors offer the advantage of reduced likelihood of damage to circuit boards while they are being inserted into or removed from the card cage. They do not, however, always provide good electrical contact with the circuit board's contacts, as they can become bent or misshapened over time and through negligent insertion and removal of the circuit board by the user. They also tend to have a higher cost than other forms of connectors. Thus, ZIF connectors have not been widely accepted by the industry.

A second type of connectors, namely, Low-Insertion-Force (LIF connectors) edge connectors, on the other hand, have been widely accepted and used. In LIF connectors, the contacts are spring based such that insertion of the circuit board into the connector overcomes the biasing force on the contacts so as to spread the contacts apart and allow the circuit board to engage the connector. The spring bias holds the connector's contacts tightly against mating contacts along the edge of the board.

Various arrangements have been developed to assist insertion of circuit boards into LIF connectors. In one arrangement, handles are mounted on the forward edge of the board which include a finger or tab member which engages a mating member affixed to the card cage into which the board is being inserted. The installer manipulates the lever by depressing the handle opposite the finger, which forces the board into the LIF connector. Often such arrangements require the use of a tool to depress the handle. In this operation the tool can slip and damage the board or components mounted thereon.

SUMMARY OF THE INVENTION

The invention provides a new and improved arrangement for inserting circuit boards into and removing them from, a card cage.

In brief summary, the new arrangement includes one or more handles pivotally mounted on the front of the card cage. Each handle, in turn, is pivotally attached to a rod which extends to the rear of the card cage and terminates in an extraction member which receives the rear corner of a circuit board. When the circuit board is mounted in the card cage, the handle is pivoted to contact the forward edge of the board and urge it into position in the cage, thereby urgin contacts along the rear edge of the board into engagement with a connector at the rear of the card cage. When the board is to be removed from the card cage, the handle is pivoted in the opposite direction, enabling the extraction member at the rear to pull the board forwardly out of engagement with the connector and permitting the board to then be removed from the card cage.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 1 is a front view of a card cage constructed in accordance with the invention;

FIG. 2 is a side view of a portion of the card cage depicted in FIG. 2, showing the detail of one slot in the card cage with a circuit board in an engaged condition;

FIG. 3 is a sectional view taken along the section line 3—3 of FIG. 2;

FIG. 4 is a sectional view taken along the section line 4—4 of FIG. 2;

DETAILED DESCRIPTION OF AN ILLUSTRATIVE EMBODIMENT

Figures 5, 5A:
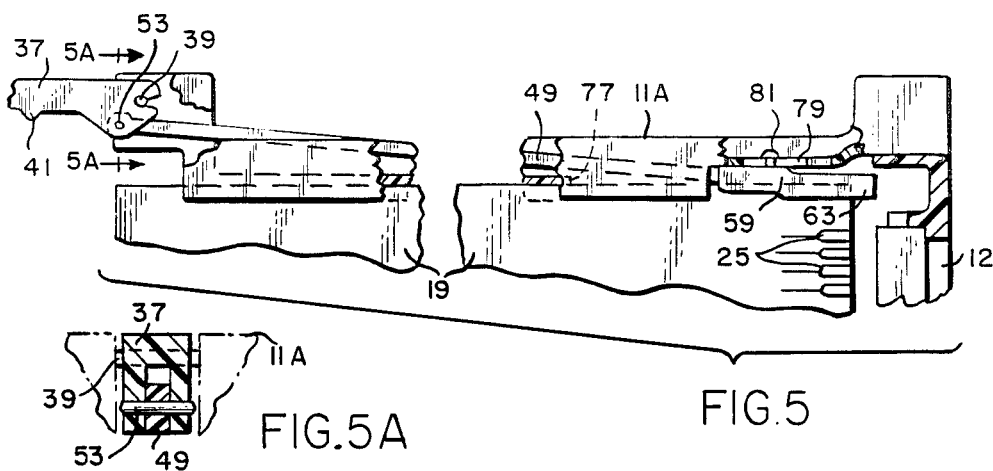
FIG. 5 is another view of the card cap as depicted in FIG. 2 showing a circuit board in a disengaged condition.

With reference to FIGS. 1 through 5, a card cage 1 constructed in accordance with the present invention includes upper support members 11A, lower support members 11B and low insertion force connectors 12 extending therebetween engaged in sets to form a plurality of slots 17, each of which receives a circuit board 19. The upper and lower support members define tracks 15 (see FIG. 3) which engages the upper and lower edges of a circuit board 19 and defines the insertion path therefor.

Each circuit board to be inserted into the card cage has along its rear (vertical) edge a row of contacts 25 (see FIG. 2). The connectors 12 are positioned to the rear of the card cage so that when a board 19 is fully inserted into a slot 17, its contacts 25 mate with spring loaded contacts 21 (see FIG. 4) in the connectors.

Each of the upper and lower support members 11A and 11B support an engagement mechanism 29 which enable a board 19 to be urged into a slot 17 and engage the connectors at the rear thereof and to disengage the connector and be removed from the slot. Specifically, the engagement mechanisms 29 urge the board 19 into engagement with a connector 12 during insertion into a slot 17, and disengages the board from the connector 12 during removal from the slot.

FIGS. 2 through 5 illustrate in greater detail enagagement mechanisms 29 associated with the upper and lower support members 11A and 11B forming one slot 17. With reference to FIGS. 2 and 5, an engagement mechanism 29 includes a handle 37 pivotally mounted by a pin 39 on the front end (the left as depicted in FIGS. 2 and 5) of the associated upper support member 11A or lower support member 11B. The pin 39 enables the handle 37 to pivot between an engaged orientation depicted in FIG. 2 and disengaged orientation depicted in FIG. 5. The handle 37 pivots in the plan defined by the tracks 15 of the associated support members 11A and 11B. Each handle 37 includes a finger 41 which engages the forward edge of circuit board 14 to urge the board into the engaged position as described below when the circuit board 19 is being inserted into the slot.

An actuating rod 49, which is pivotally attached to the handle 37 by a pin 53, extends from the handle 37 toward the low insertion force connector 12 at the rear (to the right as depicted in FIGS. 2 and 5) of the card cage 1. The rear end (that is, the end to the right, as shown in FIGS. 2 and 5) of the actuating rod is, in turn, connected to an extraction member 59, which is shown in cross-section in FIG. 4.

With reference to FIG. 4, the extraction member 59 includes a generally U-shaped channel member 61 which fits over the upper or lower edge adjacent the rear corner of the circuit board 19 when the circuit board is inserted into the card cage 1. The U-shaped channel member terminates in a rear finger 63 which extends upwardly (if in the engagement mechanism associated with the lower support member 11B) or downwardly (if in the engagement mechanism associated with the upper support member 11A) so as close off the channel at the rear end of extraction member 59. The rear finger 63, thus, contacts or is proximate to the rear end of the circuit board 3 when the board 19 is inserted into the slot 17.

The location of pin 53 on handle 37 is displaced from the location of pin 39 so that, as the handle 37 is pivoted around pin 39, the actuating rod 49 moves generally longitudinally, that is, along and generally parallel to the support members 11A and 11B. Thus, pivoting of the handle 37 around the pin 39 enables the actuating rod 49 to move the extraction member 59 forwardly or rearwardly, that is, left or right, as shown in FIGS. 2 and 5, depending on the direction in which the handle 37 is pivoted.

In operation, an operator wishing to insert a circuit board 19 into a slot 17 in the card cage 1 defined by the corresponding tracks 15 in the upper and lower support members 11A and 11B, first pivots the handles 37 associated with the slot 17 to the disengaged orientation (as shown in FIG. 5). The operator then inserts the circuit board in the slot 17 and pushes the board rearwardly so as to insert the rear corners thereof into the U-shaped channel members 61 of the upper and lower extraction members 59 associated with until the rear edge of the board meets the rear fingers 63 of the extraction members 59.

Afterward, the operator pivots the handles 37 toward their engaged orientations as shown in FIG. 2. In that operation, the fingers 41 on handles 37 contact the front edge (the left edge as shown in FIG. 2) of the circuit board 19 and urge the board to the rear (toward right as shown in FIG. 2 of the slot 17). As that occurs, the contacts 25 along the rear edge of the circuit board 19 are urged into the connector 12 at the rear of the card cage to mate with its contacts 21 to form the electrical connections with the contacts 21 of the connector 12 (as shown in FIGS. 2 and 4). It will be appreciated that this operation provides a desired wiping action between the contacts 25 on the board 19 and the contacts 21 in the connector 12 to wipe off any oxide or dirt layer and ensure good electrical connections therebetween.

Thereafter, to remove a circuit board 19 from the slot 17, the operator pivots the handles 37 of the upper and lower engagement mechanisms 29 mounted on the upper and lower support members 11A and 11B which define the slot 17 from their engaged orientations (FIG. 2) to their disengaged orientations (FIG. 5). As a result, the actuating rods 49 are moved forward (to the left as shown in FIGS. 2 and 5) thereby moving extraction members 59 attached thereto forwardly. This, in turn enables the rear fingers 63 of extraction members 59 to pull the circuit board 19 forwardly (to the left as shown in FIGS. 2 and 5) to disengage the contacts 25 along the rear end of the circuit board 19 from the connectors 12. At the same time, the handles 37 are pivoted away from the forward end of the circuit board 19, permitting the operator to slide the circuit board out of the slot 17 and, thus, out of the card cage 1.

In the embodiment depicted in FIGS. 1 through 5, the tracks in each of the upper and lower support members 11A and 11B include two sidewalls 71 and 73 which extend from the front to the rear of the card cage 1, a forward cross member 75 which extends from the front of the card cage 1 partially to the rear, and a rear cross member 76 which is positioned rearwardly from the forward cross member 75 and toward the connector 12. Between the cross members 75 and 76 is a slot 77 through which the actuating rod 49 extends. The slot 77 and cross members 75 and 76 permit the actuating rod to run externally of the slot 17, that is, externally of the cross member 75 toward the front of the card cage 1, and internally of the cross member 76 toward the rear of the card cage.

The sidewalls 71 and 73 laterally support the actuating rod 49. The actuating rods 49 are also vertically supported by the rear edge of the cross member 75 and a guide pin 81, which slides in a slot 79. Slot 79 is formed in the rear cross member 76 which defines the travel of a pin 81 which extends from the extraction member 59. The pin 81 has a cap which supports the actuating rod during the engagement mechanism 29, as it provides some support to the extraction member 59 and helps define the motion during insertion and extraction. Guide pin 81 also helps maintain the extraction members in position during assembly of the card cage and engagement mechanism 29.

Figure 6:
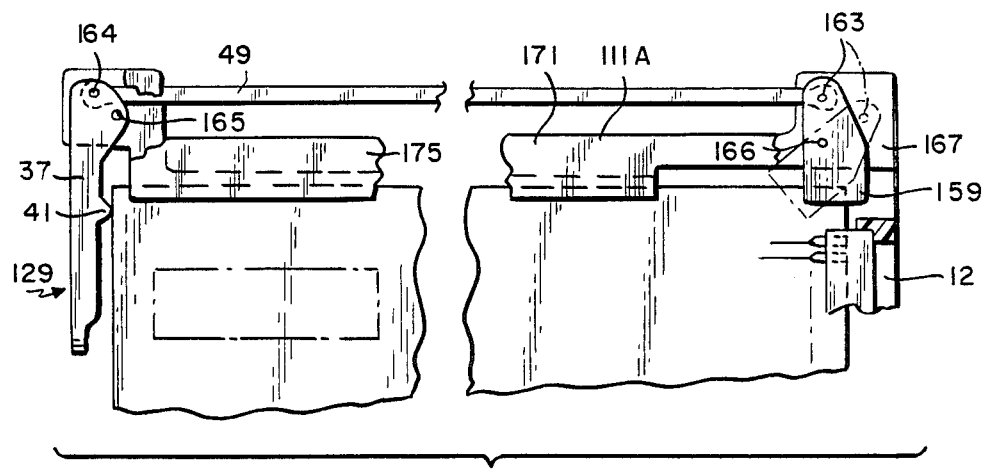
FIG. 6 is a view similar to FIG. 2 of a second embodiment of the invention, showing a circuit board in an engaged condition.
Figure 7:
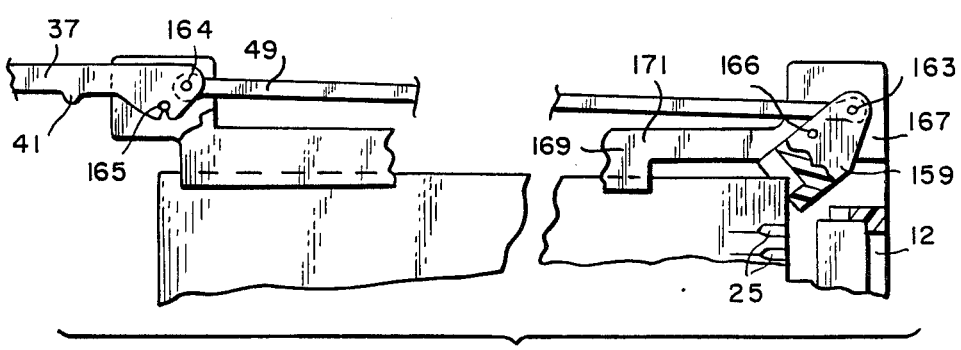
FIG. 7 is a view of the embodiment depicted in FIG. 6 showing a circuit board in a disengaged condition.

FIGS. 6 and 7 depict a second embodiment of the invention. The primary difference between the embodiment depicted in FIGS. 1 through 5 and FIGS. 6 and 7 relates to the engagement mechanism. Instead of an extraction member 59 which sliding from right to left as shown in FIGS. 2 and 5, the engagement mechanism 129 depicted in FIGS. 6 and 7 includes an extraction member 159 which pivots around a pin 166 under control of the actuating rod 49. The actuating rod 49 is pivotably attached to the extraction member 159 by pin 163 and to the handle 37 by pin 164. The handle 37, in turn, is pivotally supported on the support member 11 by pin 165. The extraction member 159 is also pivotally attached to the support member by pin 166, and the member 159 extends through a slot 167 at the rear of the cross member 169 in the support member 11. The extraction member 159 includes a channel and rear finger which are similar to corresponding elements in extraction member 59 (FIGS. 1-5).

The operation of the embodiment depicted in FIGS. 6 and 7 is similar to that previously described for the embodiment of the invention illustrated in FIGS. 1-5. When the handles 37 of the engagement mechanisms 29 associated with the upper and lower support members 11A and 11B which define a slot 15 are pivoted to their disengaged positions (as seen in FIG. 7), the operator can insert a circuit board 19 into the slot 15 until it comes into contact with the rear fingers of the extraction members 159 (as also seen in FIG. 7). The circuit board is then urged into the engaged position by the pivoting of the handle 37 to the operative position (as seen in FIG. 6). Pivoting handle 37 causes the actuating rod 49 to move forwardly (to the left as shown in FIGS. 6 and 7), which, in turn, enables extraction member 159 to pivot in a counterclockwise direction, allowing the fingers 41 on handles 37 to contact the forward edge of the circuit board 19 and urge it rearwardly (to the right as shown in FIGS. 6 and 7) into engagement with the connectors 12.

To disengage the board from the card cage 1, the operator rotates the handle 37 from the engaged position shown in FIG. 6 to the disengaged position shown in FIG. 7. This enables the actuating rod 49 to move rearwardly (that is, to the right as shown in FIGS. 6 and 7), in turn enabling the extraction member 159 to rotate clockwise around the pin 166. This, in turn, enables the rear fingers of the extraction members 159 to urge the circuit board 19 forwardly (to the left, as shown in FIGS. 6 and 7) and to disengage from the connectors 12, thereby permitting the circuit board 19 to be removed from the slot.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A card cage for removably receiving a printed circuit board having a plurality of electrical contacts along a rear edge, said card cage comprising upper and lower support means and rear connector means defining a slot for slidably receiving said circuit board and engagement means comprising:
   (A) handle means pivotally mounted onto a forward edge of one of said support means, said handle means being pivotable between an engaged orientation and a disengaged orientation, said handle means having a finger means projecting therefrom for contacting an exposed forward edge of said circuit board to urge it into an engaged position with its contacts engaging said connector means;
   (B) extraction means including a rear finger means for contacting the rear edge of said circuit board when said circuit board is in the engaged position;
   (C) actuating rod means connecting said handle means and said extraction means for enabling said extraction means to move said rear finger means forwardly as said handle means pivot between the engaged position and the disengaged position to thereby urge said circuit board to disengage from said connector means and allow said circuit board to be freely removed from said slot.

2. A card cage as defined in claim 1 wherein each of said upper and lower support means includes a pair of parallel sidewall means and a cross member means extending between said sidewall means to define a slot channel for slidably receiving said circuit board.

3. A card cage as defined in claim 1 wherein said extraction means includes means defining a channel for receiving an edge of said circuit board, said rear finger means closing off the rear of said channel.

4. A card cage as defined in claim 3 wherein said extraction means is slidably mounted on the support means on which said handle means is mounted.

5. A card cage as defined in claim 3 wherein said extraction means is pivotally mounted on the support means on which said handle means is mounted.

6. A card cage for removably receiving a printed circuit board having a plurality of electrical contacts along a rear edge, said card cage comprising upper and lower support means and rear connector means defining a slot for slidably receiving said circuit board, each of said upper and lower support means supporting an engagement means comprising:
   (A) handle means pivotally mounted onto a forward edge of the associated support means, said handle means being pivotable between an engaged orientation and a disengaged orientation, said handle means having a finger means projecting therefrom for contacting an exposed forward edge of said circuit board to urge it into an engaged position with its contacts engaging said connector means;
   (B) extraction means including a rear finger means for contacting the rear edge of said circuit board proximate the associated support means when said circuit board is in the engaged position;
   (C) actuating rod means connecting said handle means and said extraction means for enabling said extraction means to move said rear finger means forwardly as said handle means pivots between the engaged position and the disengaged position to thereby urge said circuit board to disengage from said connector means and allow said circuit board to be freely removed from said slot.

7. A card cage as defined in claim 6 wherein each of said upper and lower support means includes a pair of parallel sidewall means and a cross member means extending between said sidewall means to define a slot channel for slidably receiving said circuit board.

8. A card cage as defined in claim 6 wherein each said extraction means includes means defining a channel for receiving the proximate edge of said circuit board, said rear finger means closing off the rear of said channel.

9. A card cage as defined in claim 8 wherein each said extraction means is slidably mounted on the associated support means.

10. A card cage as defined in claim 8 wherein each said extraction means is pivotally mounted on the associated support means.

11. A card cage for removably receiving a printed circuit board having a plurality of electrical contacts along a rear edge, said card cage comprising:
(A) upper support means including parallel sidewalls and a cross member defining an upper channel, said upper support means having a forward end and a rear end;
(B) lower support means including parallel sidewalls and a cross member defining a lower channel, said lower support means having a forward end and a rear end, said upper support means and said lower support means being positioned in parallel with said upper channel and said lower channel in spatial opposition to thereby define a slot for slidably receiving a circuit board;
(C) rear connector means extending between the respective rear ends of said upper and lower support means;
(D) engagement means associated with each of said support means and comprising;
  (i) handle means pivotally mounted onto the forward end of the associated support means, said handle means being pivotable between an engaged orientation and a disengaged orientation, said handle means having a finger means projecting therefrom for contacting an exposed forward edge of said circuit board to urge it into an engaged position with its contacts engaging said connector means;
  (ii) extraction means including a rear finger means for contacting the rear edge of said circuit board proximate the associated support means when said circuit board is in the engaged position; and
  (iii) actuating rod means connecting said handle means and said extraction means for enabling said extraction means to move said rear finger means forwardly as said handle means pivots between the engaged position and the disengaged position to thereby urge said circuit board to disengage from said connector means and allow said circuit board to be freely removed from said slot.

12. A card cage as defined in claim 11 wherein each of said upper and lower support means includes a pair of parallel sidewall means and a cross member means extending between said sidewall means to define a slot channel for slidably receiving said circuit board.

13. A card cage as defined in claim 11 wherein each said extraction means includes means defining a channel for receiving the proximate edge of said circuit board, said rear finger means closing off the rear of said channel.

14. A card cage as defined in claim 13 wherein each said extraction means is slidably mounted on the associated support means.

15. A card cage as defined in claim 13 wherein each said extraction means is pivotally mounted on the associated support means.

* * * * *